(12) United States Patent
Yang et al.

(10) Patent No.: US 11,991,695 B2
(45) Date of Patent: May 21, 2024

(54) HANDLING TIME-VARYING PACKET SIZE IN DOWNLINK

(71) Applicant: Apple Inc., Cupertino, CA (US)

(72) Inventors: Weidong Yang, Cupertino, CA (US); Arjun Bharadwaj, Beijing (CN); Chunhai Yao, Beijing, CA (US); Chunxuan Ye, Cupertino, CA (US); Dawei Zhang, Cupertino, CA (US); Haitong Sun, Cupertino, CA (US); Hong He, Cupertino, CA (US); Huaning Niu, Cupertino, CA (US); Oghenekome Oteri, Cupertino, CA (US); Seyed Ali Akbar Fakoorian, Cupertino, CA (US); Sigen Ye, Cupertino, CA (US); Wei Zeng, Cupertino, CA (US); Yushu Zhang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/598,247

(22) PCT Filed: Oct. 23, 2020

(86) PCT No.: PCT/CN2020/123451
§ 371 (c)(1),
(2) Date: Oct. 14, 2021

(87) PCT Pub. No.: WO2022/082801
PCT Pub. Date: Apr. 28, 2022

(65) Prior Publication Data
US 2022/0417969 A1 Dec. 29, 2022

(51) Int. Cl.
*H04W 72/23* (2023.01)
*H03M 13/13* (2006.01)
(Continued)

(52) U.S. Cl.
CPC ..... *H04W 72/1273* (2013.01); *H03M 13/136* (2013.01); *H04W 24/08* (2013.01); *H04W 76/20* (2018.02)

(58) Field of Classification Search
None
See application file for complete search history.

(56) References Cited

U.S. PATENT DOCUMENTS

| 2011/0170500 A1* | 7/2011 | Kuo | H04W 72/23 370/329 |
| 2011/0223924 A1* | 9/2011 | Lohr | H04L 1/1607 455/450 |

(Continued)

*Primary Examiner* — Sai Aung
(74) *Attorney, Agent, or Firm* — Womble Bond Dickinson (US) LLP

(57) ABSTRACT

A method and apparatus of a device that handles time-varying packet size in the downlink. In some embodiments, the method performed by a user equipment (UE) comprises: receiving a first signaling comprising configuration of downlink (DL) Semi-Persistent Scheduling (SPS), wherein the DL SPS configuration comprises a periodicity of the DL SPS and a first indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity to decode a second indication; determining the size of the second physical layer resource for SPS DL data transmission, based on the second indication; and receiving data on the second physical layer resource determined for each SPS occasion based on the determined size.

20 Claims, 14 Drawing Sheets

(51) Int. Cl.
*H04L 5/00* (2006.01)
*H04W 24/08* (2009.01)
*H04W 72/12* (2023.01)
*H04W 72/1273* (2023.01)
*H04W 76/20* (2018.01)

(56) References Cited

U.S. PATENT DOCUMENTS

| | | | | |
|---|---|---|---|---|
| 2017/0048828 | A1* | 2/2017 | Um | H04L 1/0061 |
| 2018/0167930 | A1* | 6/2018 | Huang | H04L 5/0032 |
| 2018/0213523 | A1* | 7/2018 | Song | H04L 5/0055 |
| 2020/0229195 | A1* | 7/2020 | Lien | H04L 5/001 |
| 2021/0036822 | A1* | 2/2021 | Lyu | H04L 5/0048 |
| 2022/0279521 | A1* | 9/2022 | Cui | H04W 76/15 |
| 2023/0354364 | A1* | 11/2023 | Guo | H04W 52/0229 |

\* cited by examiner

```
» Hyperframe 0:   0  17  34  50  67  84  100  117  134  150 ...
» Hyperframe 1:  10  27  44  60  77  94  110  127  144  160 ...
» Hyperframe 2:   4  20  37  54  70  87  104  120  137  154 ...
» Hyperframe 3:  14  30  47  64  80  97  114  130  147  164 ...
» Hyperframe 4:   7  24  40  57  74  90  107  124  140  157 ...
» Hyperframe 5:   0  17  34  50  67  84  100  117  134  150 ...  <-- slot indices repeat as in Hyperframe 0.
```

FIG. 7

```
RRC signaling for search space configuration:
SearchSpace ::= SEQUENCE {
  searchSpaceId SearchSpaceId,
  controlResourceSetId ControlResourceSetId OPTIONAL, -- Cond SetupOnly
  s1 INTEGER (0 .. (2^16-1)),
  s2 INTEGER (0 .. (2^16-1)),
  /*...*/ INTEGER (0 .. 79)

monitoringSlotPeriodicityAndOffset CHOICE {
    sl1 NULL,
    sl2 INTEGER (0..1),
    sl4 INTEGER (0..3),
    sl5 INTEGER (0..4),
    sl8 INTEGER (0..7),
    sl10 INTEGER (0..9),
    sl16 INTEGER (0..15),
    sl20 INTEGER (0..19),
    sl40 INTEGER (0..39),
    sl80 INTEGER (0..79),
    sl160 INTEGER (0..159),
    sl320 INTEGER (0..319),
    sl640 INTEGER (0..639),
    sl1280 INTEGER (0..1279),
    sl2560 INTEGER (0..2559)
  } OPTIONAL, -- Cond Setup
  duration INTEGER (2..2559) OPTIONAL, -- Need R
  monitoringSymbolsWithinSlot BITSTRING (SIZE (14)) OPTIONAL, -- Cond Setup
  ...
}
```

FIG. 8

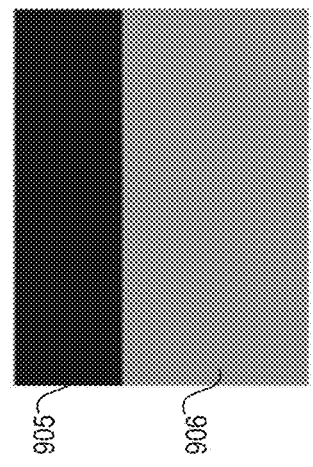
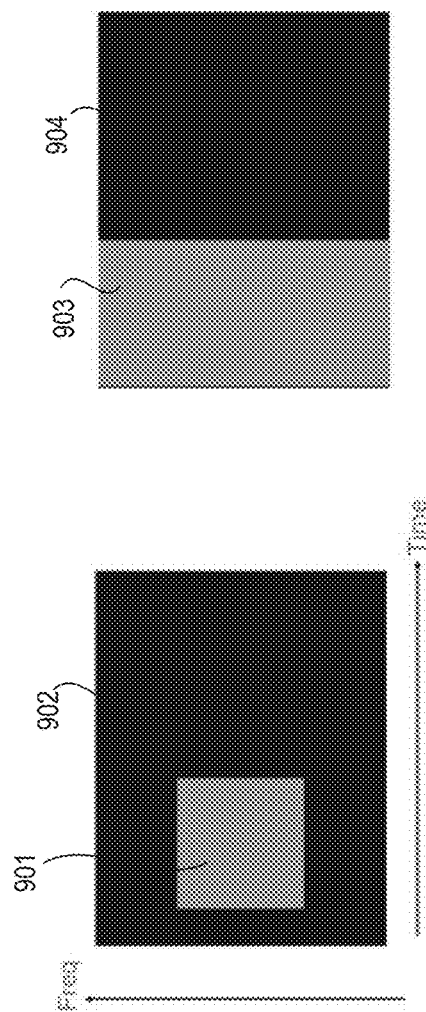
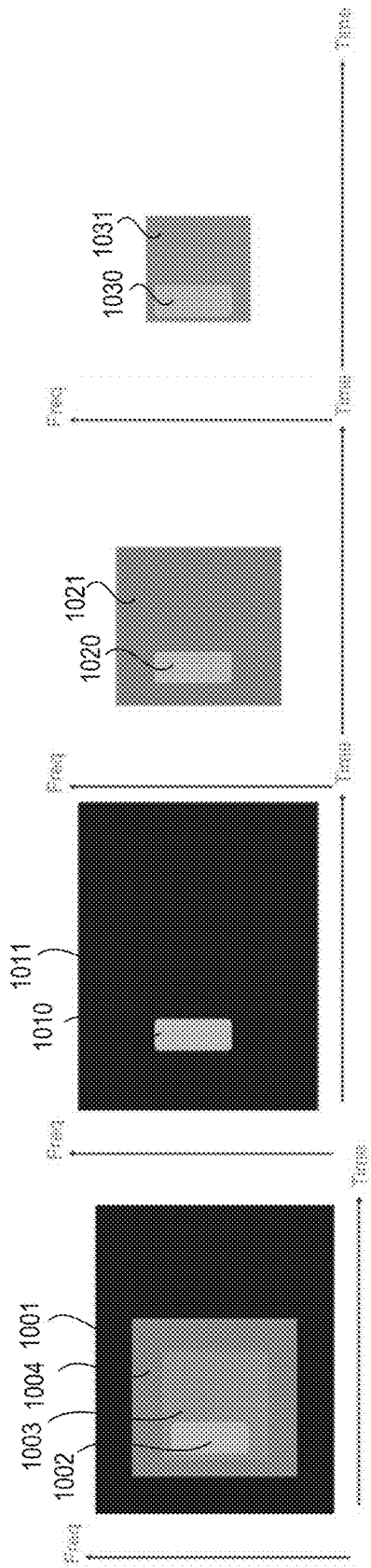
FIG. 9A  FIG. 9B  FIG. 9C
FIG. 10A  FIG. 10B  FIG. 10C  FIG. 10D

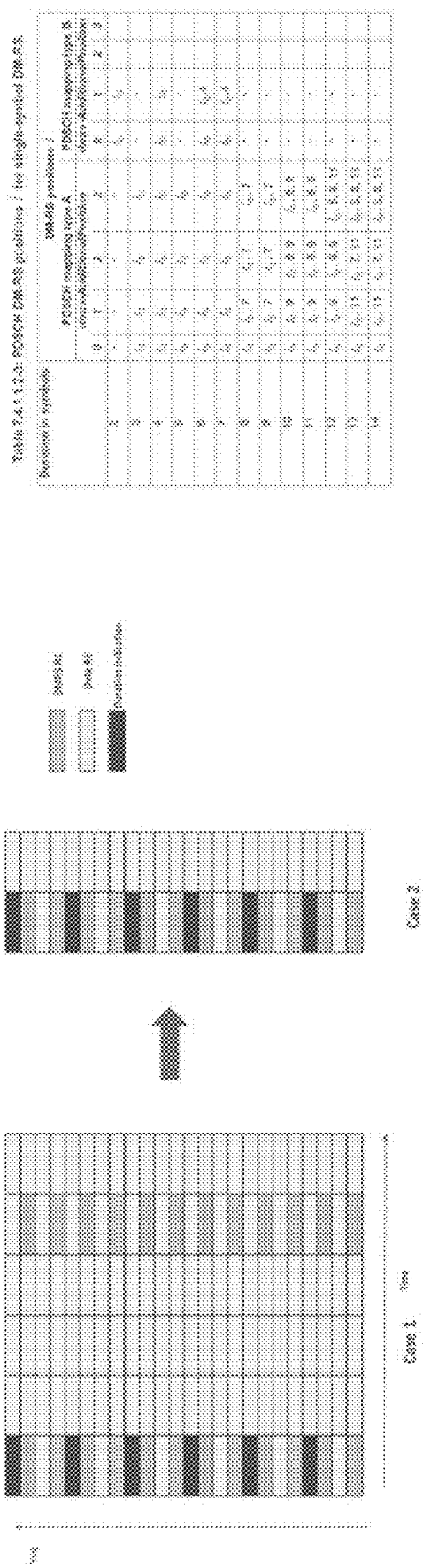
FIG. 11A
FIG. 11B
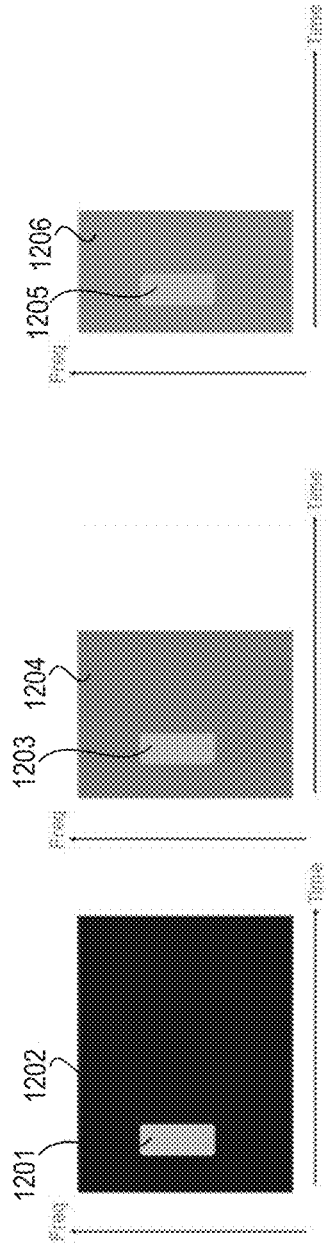
FIG. 12A
FIG. 12B
FIG. 12C

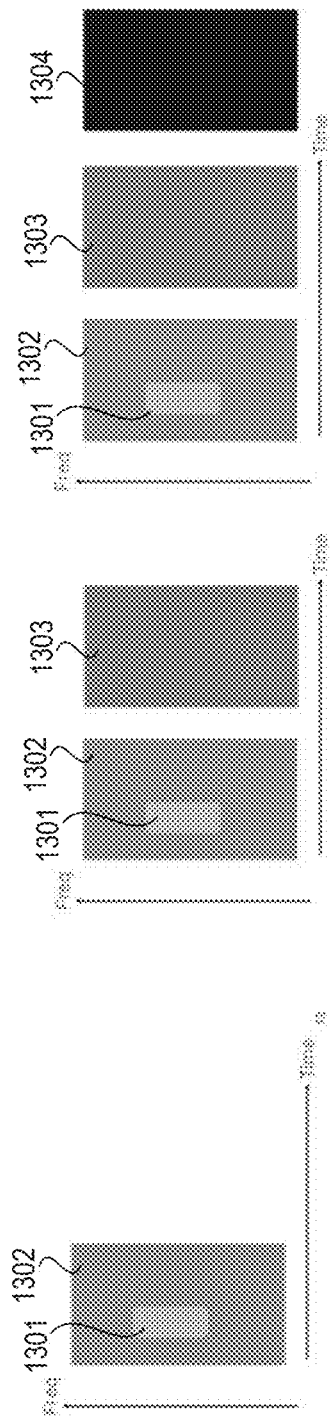
FIG. 13A
FIG. 13B
FIG. 13C
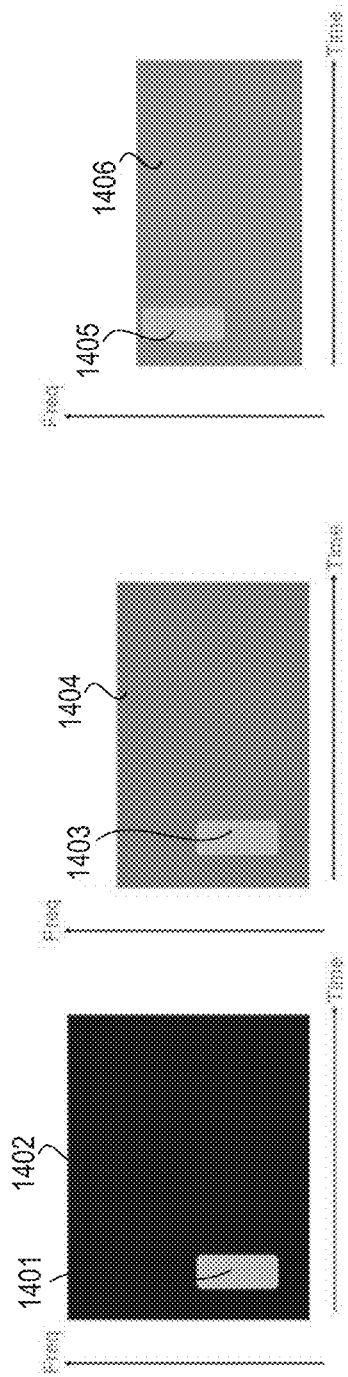
FIG. 14A
FIG. 14B
FIG. 14C

```
SPS-Config ::= SEQUENCE {
    periodicity ENUMERATED {ms10, ms20, ms32, ms40, ms64, ms80, ms128, ms160, ms320, ms640,
        spare6, spare5, spare4, spare3, spare2, spare1},
    nrofHARQ-Processes INTEGER (1..8),
    n1PUCCH-AN PUCCH-ResourceId OPTIONAL, -- Need M
    mcs-Table ENUMERATED {qam64LowSE} OPTIONAL, -- Need S
    M1 INTEGER (0 .. (2^16-1))
    M2 INTEGER (0 .. (2^16-1))
    NbOfSymbols INTEGER (1..4)
    ResourceRatio ENUMERATED {f0p5, f0p75}
    ...,
    [[
    sps-ConfigIndex-r16 SPS-ConfigIndex-r16 OPTIONAL, -- Cond SPS-List
    harq-ProcID-Offset-r16 INTEGER (0..15) OPTIONAL, -- Need R
    periodicityExt-r16 INTEGER (1..5120) OPTIONAL, -- Need R
    harq-CodebookID-r16 INTEGER (1..2) OPTIONAL, -- Need R
    pdsch-AggregationFactor-r16 ENUMERATED {n1, n2, n4, n8 } OPTIONAL -- Need S
    ]]
}
```

1701 — M1/M2 INTEGER lines
1702 — NbOfSymbols / ResourceRatio lines

FIG. 17

Receive a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission
1801

Receive a second signaling that activates reception based on the DL SPS, wherein the second signaling comprises information to specify a boundary of the second physical layer resource
1802

Monitor the first physical layer resource on each SPS occasion based on the periodicity
1803

Determine the size of the second physical layer resource for SPS DL data transmission, based on the first physical layer resource
1804

Receive data on the second physical layer resource determined for each SPS occasion based on the determined size
1805

Receive information specifying occurrence of a Discontinuous Reception (DRX) when DL data transmission is larger than can be specified for SPS resources designated for DL SPS transmission (optional)
1806

*FIG. 18*

Transmit, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission
1901

Transmit a second signaling to the UE to activate, on the UE, reception based on the DL SPS, wherein the second signaling comprises information to specify a boundary of the second physical layer resource
1902

Determine size of the second physical layer resource for SPS DL data transmission for each SPS occasion
1903

Transmit the first physical layer resource for each SPS occasion according to the periodicity
1904

Transmit data to the UE on the second physical layer resource for each SPS occasion according to the determined size
1905

Transmit information specifying occurrence of a Discontinuous Reception (DRX) when DL data transmission is larger than can be specified for SPS resources designated for DL SPS transmission (optional)
1906

*FIG. 19*

HANDLING TIME-VARYING PACKET SIZE IN DOWNLINK

FIELD OF INVENTION

Embodiments of invention relate generally to wireless technology and more particularly to handling time-varying packet size in downlink transmission.

BACKGROUND

Fifth generation mobile network (5G) is a wireless standard that aims to improve upon data transmission speed, reliability, availability, and more. This standard, while still developing, includes numerous details relating to various aspects of wireless communication, for example, NR and NR in a spectrum greater than 52.6 GHz.

SUMMARY OF THE DESCRIPTION

A method and apparatus of that handles time-varying packet size in downlink transmission are described. In some embodiments, a method performed by a user equipment (UE) comprises: receiving a first signaling comprising configuration of downlink (DL) Semi-Persistent Scheduling (SPS), wherein the DL SPS configuration comprises a periodicity of the DL SPS and a first indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity to decode a second indication; determining the size of the second physical layer resource for SPS DL data transmission, based on the second indication; and receiving data on the second physical layer resource determined for each SPS occasion based on the determined size.

In another embodiment, a method is performed by a base station and comprises transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; and transmitting data to the UE on the second physical layer resource for each SPS occasion according to the determined size.

Other methods and apparatuses are also described.

BRIEF DESCRIPTION OF THE DRAWINGS

The present invention is illustrated by way of example and not limitation in the figures of the accompanying drawings in which like references indicate similar elements.

FIG. 7 illustrates an example of using the PDCCH to indicate resource allocation adjustments.

FIG. 8 illustrates an example for RRC signaling for a search space configuration.

FIGS. 9A-9C illustrate embodiments that utilize different allocations.

FIGS. 10A-10D illustrate an example of supporting adaption of the resource allocations in both the time domain and frequency domain.

FIG. 11A illustrates two cases, one in which time-domain interpolation is used, and one in which time domain interpolation is not used.

FIG. 11B illustrates an example of PDSCH DM-RS positons for single-symbol DM-RS.

FIGS. 12A-12C illustrate one example of supporting resource adaptation in the time domain only.

FIGS. 13A-13C illustrate resource indication for using a number of PDSCHs for different transport blocks.

FIGS. 14A-14C illustrate one example of supporting adaptation in the frequency domain only

FIG. 17 illustrates examples of a DL SPS configuration.

FIG. 18 is a data flow diagram of one embodiment of a process performed by a UE for handling time-varying packet size that occurs in the downlink.

FIG. 19 is a data flow diagram of one embodiment of a process performed by a network equipment, such as, for example, a base station, for handling time-varying packet size that occurs in the downlink.

DETAILED DESCRIPTION

Figure 1:
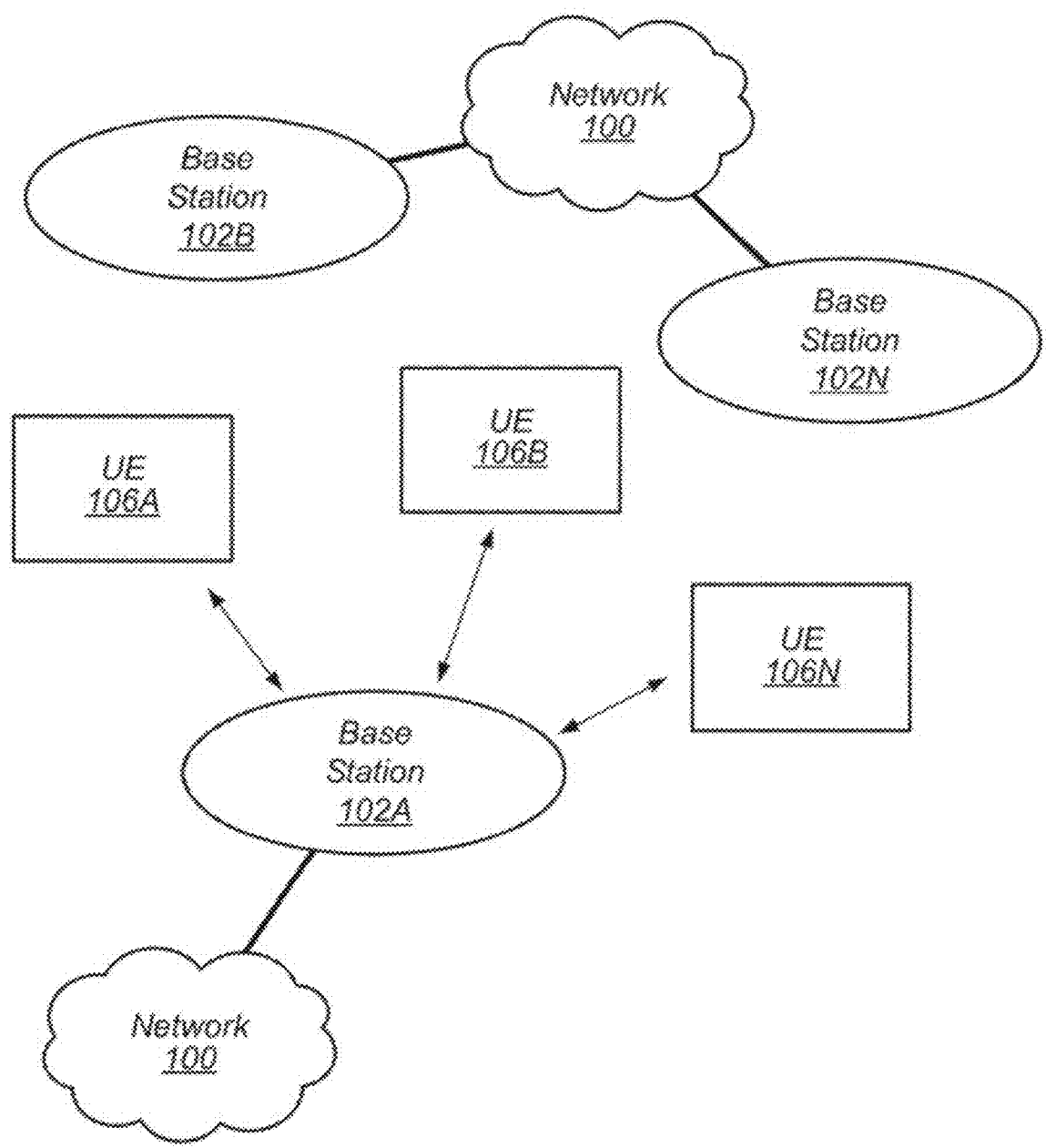
FIG. 1 illustrates an example wireless communication system according to some embodiments.

A method and apparatus for handling time-varying packet size in downlink transmission are described. In some embodiments, a user equipment (UE) handles time-varying packet size in downlink transmission by receiving a first signaling comprising configuration of downlink (DL) Semi-Persistent Scheduling (SPS), wherein the DI. SPS configuration comprises a periodicity of the DL SPS and a first indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity to decode a second indication; determining the size of the second physical layer resource for SPS DL data transmission, based on the second indication; and receiving data on the second physical layer resource determined for each SPS occasion based on the determined size. In some embodiments, a method is performed by a base station and comprises transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; and transmitting data to the UE on the second physical layer resource for each SPS occasion according to the determined size.

In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "some embodiments" or "an embodiment" means that a particular feature, structure, or characteristic described in connection with the embodiment can be included in at least one embodiment of the invention. The appearances of the phrase "in some embodiments" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

FIG. 1 illustrates a simplified example wireless communication system, according to some embodiments. It is noted that the system of FIG. 1 is merely one example of a possible system, and that features of this disclosure may be implemented in any of various systems, as desired.

As shown, the example wireless communication system includes a base station 102A which communicates over a transmission medium with one or more user devices 106A, 106B, etc., through 106N. Each of the user devices may be referred to herein as a "user equipment" (UE). Thus, the user devices 106 are referred to as UEs or UE devices.

The base station (BS) 102A may be a base transceiver station (BTS) or cell site (a "cellular base station") and may include hardware that enables wireless communication with the UEs 106A through 106N.

The communication area (or coverage area) of the base station may be referred to as a "cell." The base station 102A and the UEs 106 may be configured to communicate over the transmission medium using any of various radio access technologies (RATs), also referred to as wireless communication technologies, or telecommunication standards, such as GSM, UMTS (associated with, for example, WCDMA or TD-SCDMA air interfaces), LTE, LTE-Advanced (LTE-A), 5G new radio (5G NR), HSPA, 3GPP2 CDMA2000 (e.g., 1×RTT, 1×EV-DO, HRPD, eHRPD), etc. Note that if the base station 102A is implemented in the context of LTE, it may alternately be referred to as an 'eNodeB' or 'eNB'. Note that if the base station 102A is implemented in the context of 5G NR, it may alternately be referred to as 'gNodeB' or 'gNB'.

As shown, the base station 102A may also be equipped to communicate with a network 100 (e.g., a core network of a cellular service provider, a telecommunication network such as a public switched telephone network (PSTN), and/or the Internet, among various possibilities). Thus, the base station 102A may facilitate communication between the user devices and/or between the user devices and the network 100. In particular, the cellular base station 102A may provide UEs 106 with various telecommunication capabilities, such as voice, SMS and/or data services.

Base station 102A and other similar base stations (such as base stations 102B . . . 102N) operating according to the same or a different cellular communication standard may thus be provided as a network of cells, which may provide continuous or nearly continuous overlapping service to UEs 106A-N and similar devices over a geographic area via one or more cellular communication standards.

Thus, while base station 102A may act as a "serving cell" for UEs 106A-N as illustrated in FIG. 1, each UE 106 may also be capable of receiving signals from (and possibly within communication range of) one or more other cells (which might be provided by base stations 102B-N and/or any other base stations), which may be referred to as "neighboring cells". Such cells may also be capable of facilitating communication between user devices and/or between user devices and the network 100. Such cells may include "macro" cells, "micro" cells, "pico" cells, and/or cells which provide any of various other granularities of service area size. For example, base stations 102A-B illustrated in FIG. 1 might be macro cells, while base station 102N might be a micro cell. Other configurations are also possible.

In some embodiments, base station 102A may be a next generation base station, e.g., a 5G New Radio (5G NR) base station, or "gNB". In some embodiments, a gNB may be connected to a legacy evolved packet core (EPC) network and/or to a NR core (NRC) network. In addition, a gNB cell may include one or more transition and reception points (TRPs). In addition, a UE capable of operating according to 5G NR may be connected to one or more TRPs within one or more gNBs.

Note that a UE 106 may be capable of communicating using multiple wireless communication standards. For example, the UE 106 may be configured to communicate using a wireless networking (e.g., Wi-Fi) and/or peer-to-peer wireless communication protocol (e.g., Bluetooth, Wi-Fi peer-to-peer, etc.) in addition to at least one cellular communication protocol (e.g., GSM, UMTS (associated with, for example, WCDMA or TD-SCDMA air interfaces), LTE, LTE-A, 5G NR, HSPA, 3GPP2 CDMA2000 (e.g., 1×RTT, 1×EV-DO, HRPD, eHRPD), etc.). The UE 106 may also or alternatively be configured to communicate using one or more global navigational satellite systems (GNSS, e.g., GPS or GLONASS), one or more mobile television broadcasting standards (e.g., ATSC-M/H or DVB-H), and/or any other wireless communication protocol, if desired. Other combinations of wireless communication standards (including more than two wireless communication standards) are also possible.

Figure 2:
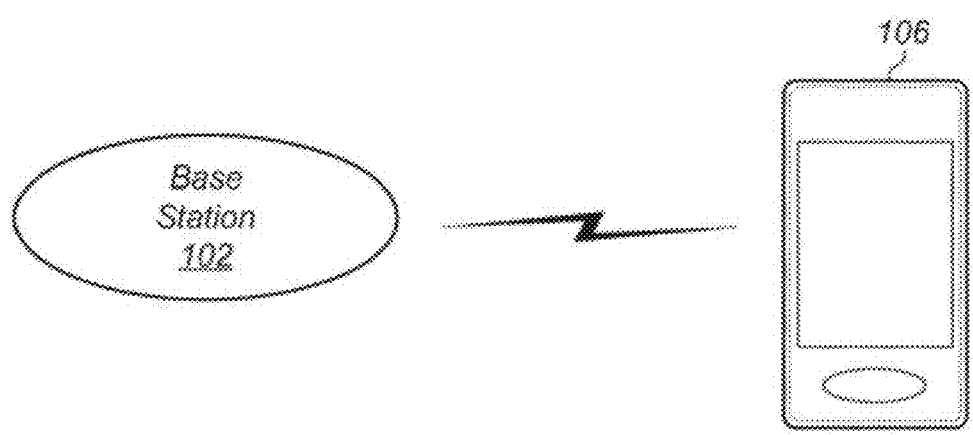
FIG. 2 illustrates a base station (BS) in communication with a user equipment (UE) device according to some embodiments.

FIG. 2 illustrates user equipment 106 (e.g., one of the devices 106A through 106N) in communication with a base station 102, according to some embodiments. The UE 106 may be a device with cellular communication capability such as a mobile phone, a hand-held device, a computer or a tablet, or virtually any type of wireless device.

The UE 106 may include a processor that is configured to execute program instructions stored in memory. The UE 106 may perform any of the method embodiments described herein by executing such stored instructions. Alternatively, or in addition, the UE 106 may include a programmable hardware element such as an FPGA (field-programmable gate array) that is configured to perform any of the method embodiments described herein, or any portion of any of the method embodiments described herein.

The UE 106 may include one or more antennas for communicating using one or more wireless communication protocols or technologies. In some embodiments, the UE 106 may be configured to communicate using, for example, CDMA2000 (1×RTT/1×EV-DO/HRPD/eHRPD) or LTE using a single shared radio and/or GSM or LTE using the single shared radio. The shared radio may couple to a single antenna, or may couple to multiple antennas (e.g., for MIMO) for performing wireless communications. In general, a radio may include any combination of a baseband processor, analog RF signal processing circuitry (e.g., including filters, mixers, oscillators, amplifiers, etc.), or digital processing circuitry (e.g., for digital modulation as well as other digital processing). Similarly, the radio may implement one or more receive and transmit chains using the aforementioned hardware. For example, the UE 106 may share one or more parts of a receive and/or transmit chain between multiple wireless communication technologies, such as those discussed above.

In some embodiments, the UE 106 may include separate transmit and/or receive chains (e.g., including separate antennas and other radio components) for each wireless communication protocol with which it is configured to communicate. As a further possibility, the UE 106 may include one or more radios which are shared between multiple wireless communication protocols, and one or more radios which are used exclusively by a single wireless communication protocol. For example, the UE 106 might include a shared radio for communicating using either of LTE or 5G NR (or LTE or 1×RTT or LTE or GSM), and separate radios for communicating using each of Wi-Fi and Bluetooth. Other configurations are also possible.

Figure 3:
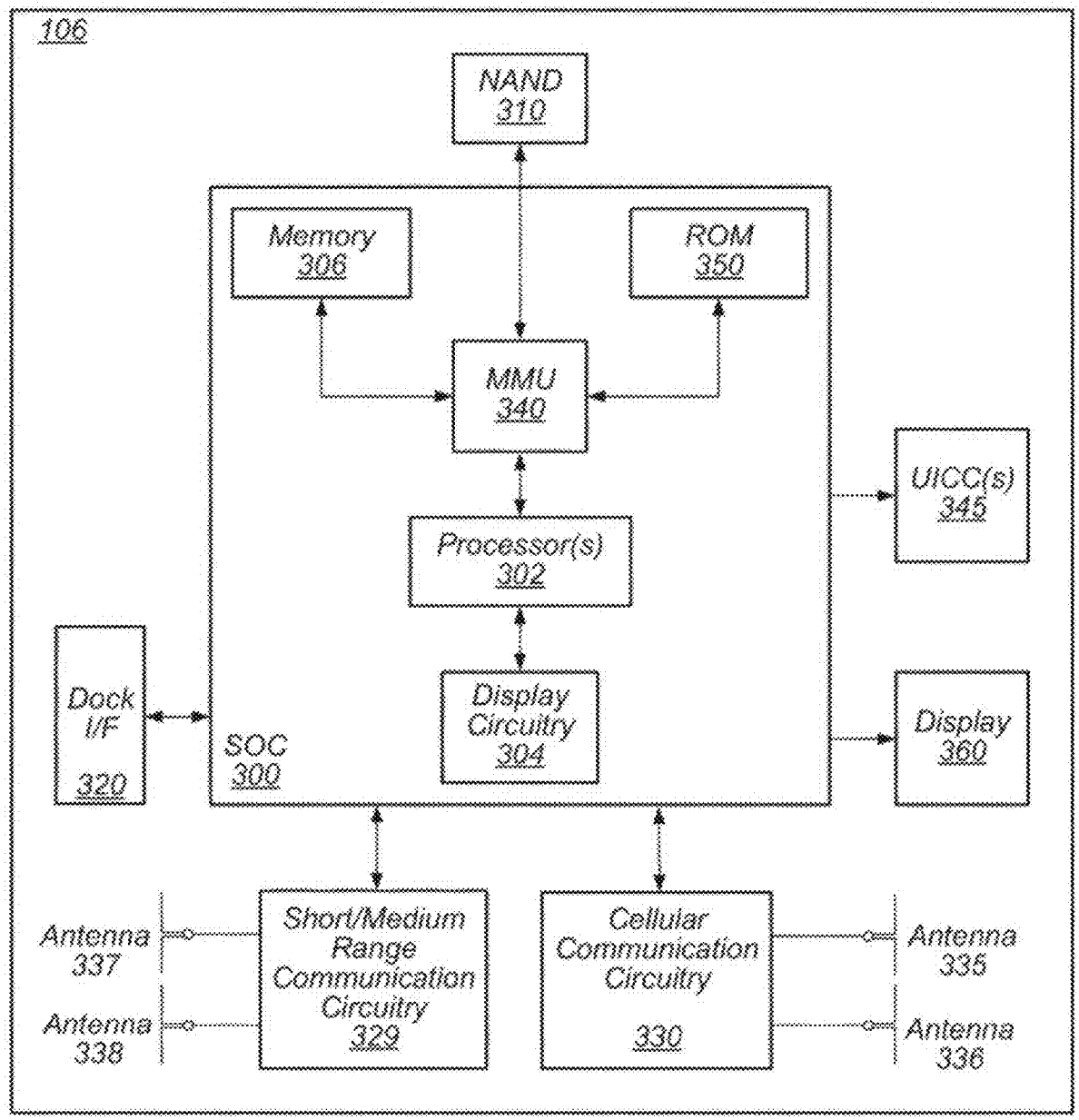
FIG. 3 illustrates an example block diagram of a UE according to some embodiments.

FIG. 3—Block Diagram of a UE

FIG. 3 illustrates an example simplified block diagram of a communication device 106, according to some embodiments. It is noted that the block diagram of the communication device of FIG. 3 is only one example of a possible communication device. According to embodiments, communication device 106 may be a user equipment (UE) device, a mobile device or mobile station, a wireless device or wireless station, a desktop computer or computing device, a mobile computing device (e.g., a laptop, notebook, or portable computing device), a tablet and/or a combination of devices, among other devices. As shown, the communication device 106 may include a set of components 300 configured to perform core functions. For example, this set of components may be implemented as a system on chip (SOC), which may include portions for various purposes. Alternatively, this set of components 300 may be implemented as separate components or groups of components for the various purposes. The set of components 300 may be coupled (e.g., communicatively; directly or indirectly) to various other circuits of the communication device 106.

For example, the communication device 106 may include various types of memory (e.g., including NAND flash 310), an input/output interface such as connector I/F 320 (e.g., for connecting to a computer system; dock; charging station; input devices, such as a microphone, camera, keyboard; output devices, such as speakers; etc.), the display 360, which may be integrated with or external to the communication device 106, and cellular communication circuitry 330 such as for 5G NR, LTE, GSM, etc., and short to medium range wireless communication circuitry 329 (e.g., Bluetooth™ and WLAN circuitry). In some embodiments, communication device 106 may include wired communication circuitry (not shown), such as a network interface card, e.g., for Ethernet.

The cellular communication circuitry 330 may couple (e.g., communicatively; directly or indirectly) to one or more antennas, such as antennas 335 and 336 as shown. The short to medium range wireless communication circuitry 329 may also couple (e.g., communicatively; directly or indirectly) to one or more antennas, such as antennas 337 and 338 as shown. Alternatively, the short to medium range wireless communication circuitry 329 may couple (e.g., communicatively; directly or indirectly) to the antennas 335 and 336 in addition to, or instead of, coupling (e.g., communicatively; directly or indirectly) to the antennas 337 and 338. The short to medium range wireless communication circuitry 329 and/or cellular communication circuitry 330 may include multiple receive chains and/or multiple transmit chains for receiving and/or transmitting multiple spatial streams, such as in a multiple-input multiple output (MIMO) configuration.

In some embodiments, as further described below, cellular communication circuitry 330 may include dedicated receive chains (including and/or coupled to, e.g., communicatively; directly or indirectly. dedicated processors and/or radios) for multiple radio access technologies (RATs) (e.g., a first receive chain for LTE and a second receive chain for 5G NR). In addition, in some embodiments, cellular communication circuitry 330 may include a single transmit chain that may be switched between radios dedicated to specific RATs. For example, a first radio may be dedicated to a first RAT, e.g., LTE, and may be in communication with a dedicated receive chain and a transmit chain shared with an additional radio, e.g., a second radio that may be dedicated to a second RAT, e.g., 5G NR, and may be in communication with a dedicated receive chain and the shared transmit chain.

The communication device 106 may also include and/or be configured for use with one or more user interface elements. The user interface elements may include any of various elements, such as display 360 (which may be a touchscreen display), a keyboard (which may be a discrete keyboard or may be implemented as part of a touchscreen display), a mouse, a microphone and/or speakers, one or more cameras, one or more buttons, and/or any of various other elements capable of providing information to a user and/or receiving or interpreting user input.

The communication device 106 may further include one or more smart cards 345 that include SIM (Subscriber Identity Module) functionality, such as one or more UICC(s) (Universal Integrated Circuit Card(s)) cards 345.

As shown, the SOC 300 may include processor(s) 302, which may execute program instructions for the communication device 106 and display circuitry 304, which may perform graphics processing and provide display signals to the display 360. The processor(s) 302 may also be coupled to memory management unit (MMU) 340, which may be configured to receive addresses from the processor(s) 302 and translate those addresses to locations in memory (e.g., memory 306, read only memory (ROM) 350, NAND flash memory 310) and/or to other circuits or devices, such as the display circuitry 304, short range wireless communication circuitry 229, cellular communication circuitry 330, connector I/F 320, and/or display 360. The MMU 340 may be configured to perform memory protection and page table translation or set up. In some embodiments, the MMU 340 may be included as a portion of the processor(s) 302.

As noted above, the communication device 106 may be configured to handle time-varying packet size in downlink transmission. That is, in some embodiments, the communication device 105 is configured to receive a first signaling comprising configuration of downlink (DL) Semi-Persistent Scheduling (SPS), where the DL SPS configuration comprises a periodicity of the DL SPS and a first indication for a first physical layer resource, and wherein the first physical layer resource is used to dynamically modify size of a second physical layer resource for SPS DL data transmission. The communication device 105 is also configured to receive a second signaling that activates reception based on the DL SPS, wherein the second signaling comprises information to specify a boundary of the second physical layer resource. The communication device 105 is also configured to monitor the first physical layer resource on each SPS occasion based on the periodicity to decode a second indication, determine the size of the second physical layer resource for SPS DL data transmission, based on the second indication, and receive data on the second physical layer resource determined for each SPS occasion based on the determined size.

As described herein, the communication device 106 may include hardware and software components for implementing the above features for determining a physical downlink shared channel scheduling resource for a communications device 106 and a base station. The processor 302 of the communication device 106 may be configured to implement part or all of the features described herein, e.g., by executing program instructions stored on a memory medium (e.g., a non-transitory computer-readable memory medium). Alternatively (or in addition), processor 302 may be configured as a programmable hardware element, such as an FPGA (Field Programmable Gate Array), or as an ASIC (Application Specific Integrated Circuit). Alternatively (or in addition), the processor 302 of the communication device 106, in conjunction with one or more of the other components 300, 304, 306, 310, 320, 329, 330, 340, 345, 350, 360 may be configured to implement part or all of the features described herein.

In addition, as described herein, processor 302 may include one or more processing elements. Thus, processor 302 may include one or more integrated circuits (ICs) that are configured to perform the functions of processor 302. In addition, each integrated circuit may include circuitry (e.g., first circuitry, second circuitry, etc.) configured to perform the functions of processor(s) 302.

Further, as described herein, cellular communication circuitry 330 and short range wireless communication circuitry 329 may each include one or more processing elements. In other words, one or more processing elements may be included in cellular communication circuitry 330 and, similarly, one or more processing elements may be included in short range wireless communication circuitry 329. Thus, cellular communication circuitry 330 may include one or more integrated circuits (ICs) that are configured to perform the functions of cellular communication circuitry 330. In addition, each integrated circuit may include circuitry (e.g., first circuitry, second circuitry, etc.) configured to perform the functions of cellular communication circuitry 230. Similarly, the short range wireless communication circuitry 329 may include one or more ICs that are configured to perform the functions of short range wireless communication circuitry 32. In addition, each integrated circuit may include circuitry (e.g., first circuitry, second circuitry, etc.) configured to perform the functions of short range wireless communication circuitry 329.

Figure 4:
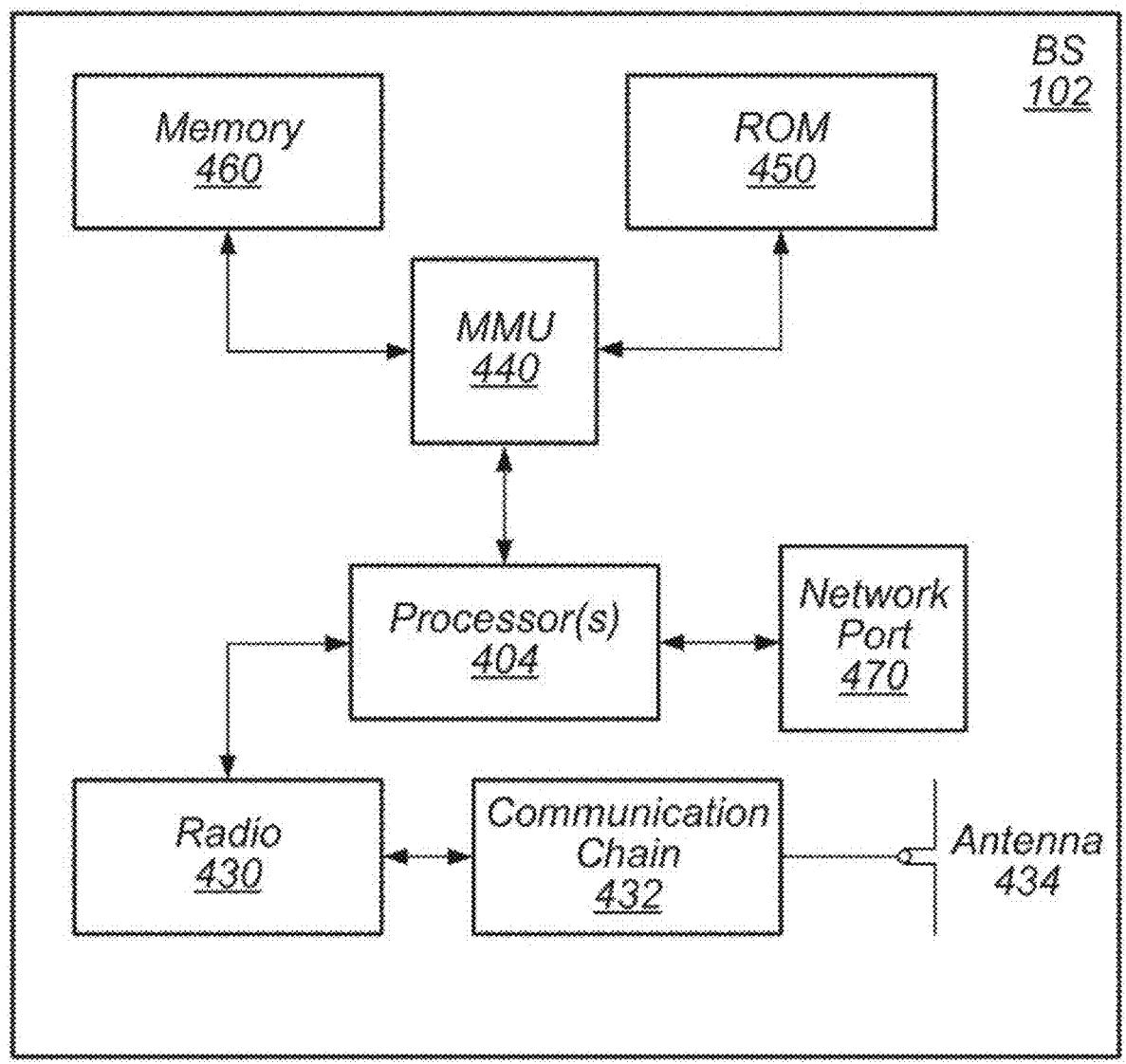
FIG. 4 illustrates an example block diagram of a BS according to some embodiments.

FIG. 4—Block Diagram of a Base Station

FIG. 4 illustrates an example block diagram of a base station 102, according to some embodiments. It is noted that the base station of FIG. 4 is merely one example of a possible base station. As shown, the base station 102 may include processor(s) 404 which may execute program instructions for the base station 102. The processor(s) 404 may also be coupled to memory management unit (MMU) 440, which may be configured to receive addresses from the processor(s) 404 and translate those addresses to locations in memory (e.g., memory 460 and read only memory (ROM) 450) or to other circuits or devices.

The base station 102 may include at least one network port 470. The network port 470 may be configured to couple to a telephone network and provide a plurality of devices, such as UE devices 106, access to the telephone network as described above in FIGS. 1 and 2.

The network port 470 (or an additional network port) may also or alternatively be configured to couple to a cellular network, e.g., a core network of a cellular service provider. The core network may provide mobility related services and/or other services to a plurality of devices, such as UE devices 106. In some cases, the network port 470 may couple to a telephone network via the core network, and/or the core network may provide a telephone network (e.g., among other UE devices serviced by the cellular service provider).

In some embodiments, base station 102 may be a next generation base station, e.g., a 5G New Radio (5G NR) base station, or "gNB". In such embodiments, base station 102 may be connected to a legacy evolved packet core (EPC) network and/or to a NR core (NRC) network. In addition, base station 102 may be considered a 5G NR cell and may include one or more transition and reception points (TRPs). In addition, a UE capable of operating according to 5G NR may be connected to one or more TRPs within one or more gNB s.

The base station 102 may include at least one antenna 434, and possibly multiple antennas. The at least one antenna 434 may be configured to operate as a wireless transceiver and may be further configured to communicate with UE devices 106 via radio 430. The antenna 434 communicates with the radio 430 via communication chain 432. Communication chain 432 may be a receive chain, a transmit chain or both. The radio 430 may be configured to communicate via various wireless communication standards, including, but not limited to, 5G NR, LTE, LTE-A, GSM, UMTS, CDMA2000, Wi-Fi, etc.

The base station 102 may be configured to communicate wirelessly using multiple wireless communication standards. In some instances, the base station 102 may include multiple radios, which may enable the base station 102 to communicate according to multiple wireless communication technologies. For example, as one possibility, the base station 102 may include an LTE radio for performing communication according to LTE as well as a 5G NR radio for performing communication according to 5G NR. In such a case, the base station 102 may be capable of operating as both an LTE base station and a 5G NR base station. As another possibility, the base station 102 may include a multi-mode radio which is capable of performing communications according to any of multiple wireless communication technologies (e.g., 5G NR and Wi-Fi, LTE and Wi-Fi, LTE and UMTS, LTE and CDMA2000, UMTS and GSM, etc.).

As described further subsequently herein, the BS 102 may include hardware and software components for implementing or supporting implementation of features described herein. The processor 404 of the base station 102 may be configured to implement or support implementation of part or all of the methods described herein, e.g., by executing program instructions stored on a memory medium (e.g., a non-transitory computer-readable memory medium). Alternatively, the processor 404 may be configured as a programmable hardware element, such as an FPGA (Field Programmable Gate Array), or as an ASIC (Application Specific Integrated Circuit), or a combination thereof. Alternatively (or in addition), the processor 404 of the BS 102, in conjunction with one or more of the other components 430, 432, 434, 440, 450, 460, 470 may be configured to implement or support implementation of part or all of the features described herein.

In addition, as described herein, processor(s) 404 may be comprised of one or more processing elements. In other words, one or more processing elements may be included in processor(s) 404. Thus, processor(s) 404 may include one or more integrated circuits (ICs) that are configured to perform the functions of processor(s) 404. In addition, each integrated circuit may include circuitry (e.g., first circuitry, second circuitry, etc.) configured to perform the functions of processor(s) 404.

Further, as described herein, radio 430 may be comprised of one or more processing elements. In other words, one or more processing elements may be included in radio 430. Thus, radio 430 may include one or more integrated circuits (ICs) that are configured to perform the functions of radio 430. In addition, each integrated circuit may include circuitry (e.g., first circuitry, second circuitry, etc.) configured to perform the functions of radio 430.

Figure 5:
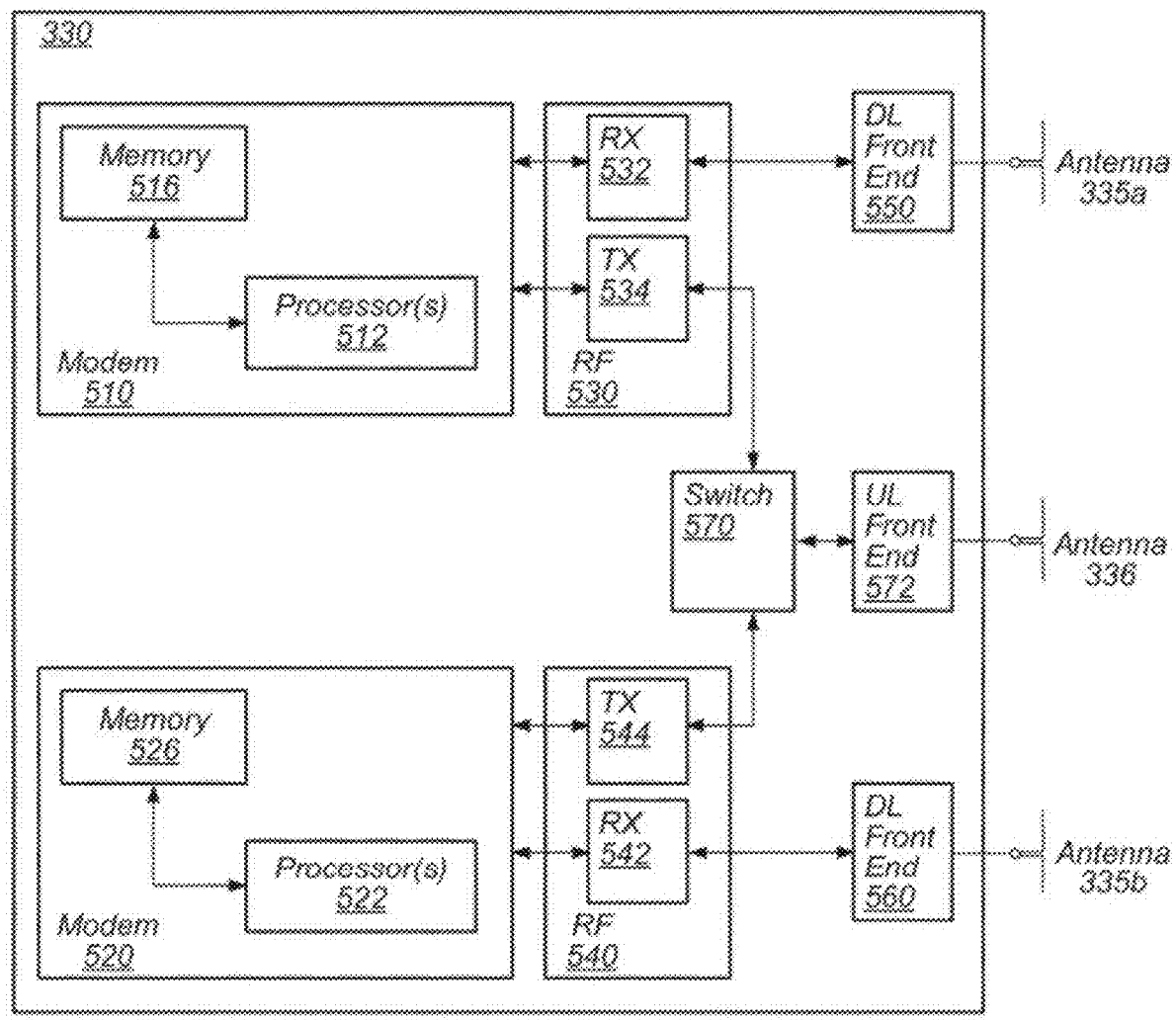
FIG. 5 illustrates an example block diagram of cellular communication circuitry, according to some embodiments.

FIG. 5: Block Diagram of Cellular Communication Circuitry

FIG. 5 illustrates an example simplified block diagram of cellular communication circuitry, according to some embodiments. It is noted that the block diagram of the cellular communication circuitry of FIG. 5 is only one example of a possible cellular communication circuit. According to embodiments, cellular communication circuitry 330 may be included in a communication device, such as communication device 106 described above. As noted above, communication device 106 may be a user equipment (UE) device, a mobile device or mobile station, a wireless device or wireless station, a desktop computer or computing device, a mobile computing device (e.g., a laptop, notebook, or portable computing device), a tablet and/or a combination of devices, among other devices.

The cellular communication circuitry 330 may couple (e.g., communicatively; directly or indirectly) to one or more antennas, such as antennas 335 a-b and 336 as shown (in FIG. 3). In some embodiments, cellular communication circuitry 330 may include dedicated receive chains (including and/or coupled to, e.g., communicatively; directly or indirectly. dedicated processors and/or radios) for multiple RATs (e.g., a first receive chain for LTE and a second receive chain for 5G NR). For example, as shown in FIG. 5, cellular communication circuitry 330 may include a modem 510 and a modem 520. Modem 510 may be configured for communications according to a first RAT, e.g., such as LTE or LTE-A, and modem 520 may be configured for communications according to a second RAT, e.g., such as 5G NR.

As shown, modem 510 may include one or more processors 512 and a memory 516 in communication with processors 512. Modem 510 may be in communication with a radio frequency (RF) front end 530. RF front end 530 may include circuitry for transmitting and receiving radio signals. For example, RF front end 530 may include receive circuitry (RX) 532 and transmit circuitry (TX) 534. In some embodiments, receive circuitry 532 may be in communication with downlink (DL) front end 550, which may include circuitry for receiving radio signals via antenna 335a.

Similarly, modem 520 may include one or more processors 522 and a memory 526 in communication with processors 522. Modem 520 may be in communication with an RF front end 540. RF front end 540 may include circuitry for transmitting and receiving radio signals. For example, RF front end 540 may include receive circuitry 542 and transmit circuitry 544. In some embodiments, receive circuitry 542 may be in communication with DL front end 560, which may include circuitry for receiving radio signals via antenna 335b.

In some embodiments, a switch 570 may couple transmit circuitry 534 to uplink (UL) front end 572. In addition, switch 570 may couple transmit circuitry 544 to UL front end 572. UL front end 572 may include circuitry for transmitting radio signals via antenna 336. Thus, when cellular communication circuitry 330 receives instructions to transmit according to the first RAT (e.g., as supported via modem 510), switch 570 may be switched to a first state that allows modem 510 to transmit signals according to the first RAT (e.g., via a transmit chain that includes transmit circuitry 534 and UL front end 572). Similarly, when cellular communication circuitry 330 receives instructions to transmit according to the second RAT (e.g., as supported via modem 520), switch 570 may be switched to a second state that allows modem 520 to transmit signals according to the second RAT (e.g., via a transmit chain that includes transmit circuitry 544 and UL front end 572).

As described herein, the modem 510 may include hardware and software components for implementing the above features or for switching a bandwidth part for a user equipment device and a base station, as well as the various other techniques described herein. The processors 512 may be configured to implement part or all of the features described herein, e.g., by executing program instructions stored on a memory medium (e.g., a non-transitory computer-readable memory medium). Alternatively (or in addition), processor 512 may be configured as a programmable hardware element, such as an FPGA (Field Programmable Gate Array), or as an ASIC (Application Specific Integrated Circuit). Alternatively (or in addition), the processor 512, in conjunction with one or more of the other components 530, 532, 534, 550, 570, 572, 335 and 336 may be configured to implement part or all of the features described herein.

In addition, as described herein, processors 512 may include one or more processing elements. Thus, processors 512 may include one or more integrated circuits (ICs) that are configured to perform the functions of processors 512. In addition, each integrated circuit may include circuitry (e.g., first circuitry, second circuitry, etc.) configured to perform the functions of processors 512.

As described herein, the modem 520 may include hardware and software components for implementing the above features for switching bandwidth parts on a wireless link between a UE and a base station, as well as the various other techniques described herein. The processors 522 may be configured to implement part or all of the features described herein, e.g., by executing program instructions stored on a memory medium (e.g., a non-transitory computer-readable memory medium). Alternatively (or in addition), processor 522 may be configured as a programmable hardware element, such as an FPGA (Field Programmable Gate Array), or as an ASIC (Application Specific Integrated Circuit). Alternatively (or in addition), the processor 522, in conjunction with one or more of the other components 540, 542, 544, 550, 570, 572, 335 and 336 may be configured to implement part or all of the features described herein.

In addition, as described herein, processors 522 may include one or more processing elements. Thus, processors 522 may include one or more integrated circuits (ICs) that are configured to perform the functions of processors 522. In addition, each integrated circuit may include circuitry (e.g., first circuitry, second circuitry, etc.) configured to perform the functions of processors 522.

As described above, in 5G New Radio (NR), in some embodiments, a user equipment (UE) receives and obtains data packets related to different applications from a gNB (e.g., a base station), including, but not limited to, XR (e.g., augmented reality, virtual reality, etc.) and gaming (e.g., cloud gaming) applications. These applications cause traffic to flow between the UE and the gNB.

Figure 6:
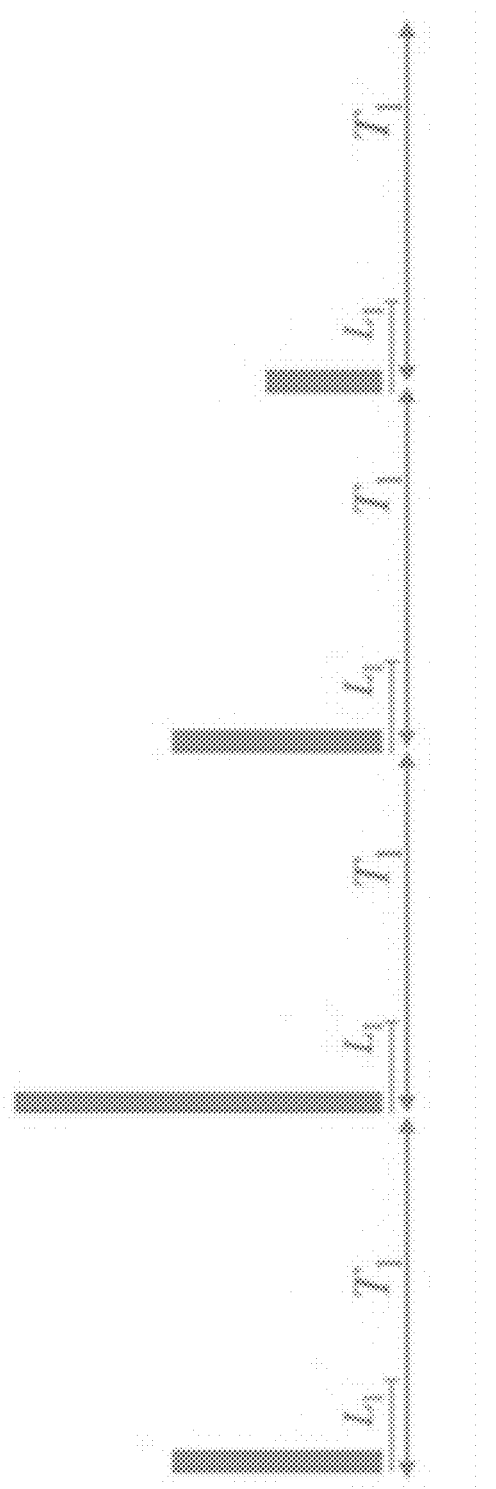
FIG. 6 illustrates an example of an XR service producing different sized packets at different times.

More specifically, for an XR service, a video stream may be isochronous with time-varying packet size. That is, the XR service may provide data packets that have different sizes at different times. For example, if the XR service produces a video stream generation at 60 frames per seconds, then at one occasion, the video codec generates a reference frame, which results in a frame that is large in size, which may be carried by multiple packets at lower layers, while on other occasions, the video codec generates frames of smaller sizes. FIG. 6 illustrates an example of an XR service producing different sized packets at different times. Referring to FIG. 6, T1 is for periodicity, L1 is the latency bound, and the height of a bar is proportional to the packet size.

In the current NR design, as given by 3GPP TS 38.331, a search space is configured with monitoringSlotPeriodicityAndOffset, duration and monitoringSymbolsWithinSlot. As PDCCH monitoring can consume UE power, the Rel-15/Rel-16 design leads to UE power consumption even if there is no traffic to the UE. Consequently incurring PDCCH monitoring for actual traffic, and adaption of PDCCH monitoring according traffic change in terms of periodicity and offset in a periodicity can help limit PDCCH monitoring to essential processing needed for actual traffic, e.g. in DL for SPS PDSCH, and in UL for CG PUSCH. Also the PDCCH monitoring is configured through RRC signaling in NR Rel-15/16 design, which may not be nimble enough to adapt to traffic change. To address those issues, in some embodiments, adaptation through MAC CE can be used, e.g. a search space can be turned on/activated/configured or turned off/de-activated/de-configured by a MAC CE, alternatively or in addition, signaling concerning monitoringSlotPeriodicityAndOffset and/or duration and/or monitoringSymbolsWithinSlot can be provided in the MaC CE. monitoringSlotPeriodicityAndOffset can be represented by $M_1$, $M_2$ and signaling for offset through RRC signaling or with MAC CE. Some essential signaling for network operation can be still indicated by PDCCH monitored at search space(s) as configured by RRC with monitoringSlotPeriodicityAndOffset and/or duration and/or monitoringSymbolsWithinSlot in the IE. In some embodiments, for a proposed search space linked to a DL SPS, monitoringSlotPeriodicityAndOffset and duration can be omitted in the RRC configured of the search space, instead, and the monitoring occasions of PDCCH is provided by the DL SPS configuration such as, for example, its periodicity (e.g. with "periodicity" or $M_1/M_2$ and the jitter window design described in concurrently filed PCT application no. PCT/CN2020/123278, entitled "Methods and Apparatus for Support of Data Transmission Traffic with Non-integer Periodicity in Wireless Communication", assigned to the same assignee); in some embodiments, there is one PDCCH monitoring occasion for each DL SPS reception occasion; in some other embodiments, there is one PDCCH monitoring occasion on the reference reception occasion.

Due to the isochronous nature of the application traffic described, in some embodiments, downlink (DL) Semi-Persistent Scheduling (SPS) is used to transfer the traffic. For example, in some embodiments, the DL SPS Physical Data Shared Channel (PDSCH) is configured to transfer application layer traffic, such as, for example, but not limited to, video traffic generated at 60 frames per second. However, if the gNB has to assign DL SPS according to the largest packet size, it can be very wasteful, thereby potentially limiting the number of UEs using XR in a cell. In some embodiments, the gNB adapts the DL SPS PDSCH allocation size according to traffic, such as shown in FIG. 6. In some embodiments, the signaling used to indicate resource allocation adjustments from one video frame to another is embedded in the DL SPS PDSCH.

Alternatively, in some embodiments, the signaling used is dynamic signaling with the PDCCH to schedule dynamic grant PDSCH instead of using SPS PDSCH. FIG. 7 illustrates an example of using the PDCCH to indicate resource allocation adjustments. Referring to FIG. 7, as SPS PDSCH can appear in slot 0, 4, 7, 10, 14, 17, In some embodiments, a search space is configured with monitoring occasions in each slot to cover all slots with a PDSCH presence. Using the PDCCH not associated with the DL SPS PDSCH to monitor for resource allocation adjustments may not be the best in terms of UE power consumption. For example, the UE does not expect to receive any PDSCH presence in slots 1,2,3 in any hyperframe, but the UE would still monitor PDCCH scheduling PDSCH transmission in those slots. To conserve UE power consumption, then multiple search spaces may need to be used to cover those slots. However, on each DL BWP, the number of search spaces may be actually limited (e.g., only up to 10 search spaces may be configured for a UE). Thus, there may be difficulty in configuring multiple search spaces.

Alternatively, the search space is configured in a similar fashion for DL SPS/uplink configured grant. In this case, a gNB can use PDCCH from monitoring occasions matched to the traffic arrival to select any resource allocation deemed suitable for the traffic. However, as the UE receiver may need to configure its processors to process PDCCH blind detection from multiple component carriers (CCs) as found in carrier aggregation, if monitoring occasions from different CCs are not aligned or their relative positions change in a somewhat irregular fashion, for example due to irregular positions of monitoring occasions from slot to slot on a CC, the UE implementation can be impacted. FIG. 8 illustrates an example for RRC signaling for a search space configuration. In one example, a DL SPS configuration is configured with non-integer periodicity through $M_1$ and $M_2$, a linkage can be created with the DL SPS configuration and search space configuration, e.g. by referring to the DL SPS configuration in the search space configuration, or referring to the search space configuration from the DL SPS configuration, a new RRC Information Element (IE) including the search space configuration and the DL SPS configuration.

In some embodiments, the UE's PDCCH monitoring behavior is regulated by the DRX configuration and search space configuration(s), and the UE's PDSCH processing behavior is controlled by the DL SPS signaling. With the DL SPS signaling design, PDCCH monitoring occasions and SPS PDSCH receptions with potential resource adjustments are decoupled. In some embodiments, the UE is configured with a long DRX cycle and a short SPS periodicity. In some other embodiments, a UE is configured with dense PDCCH monitoring occasions and also frequent SPS DPDSCH receptions with potential resource adjustments. In yet other embodiments, a UE is configured with sparse PDCCH monitoring occasions and also frequent SPS DPDSCH receptions with potential resource adjustments.

Resource Adjustments Using DL SPS PSDCH

As discussed above, in some embodiments the gNB embeds signaling information in part of the DL SPS Physical Data Shared Channel (PDSCH), so the UE can detect the embedded information to determine the current DL SPS resources. FIGS. 9A-9C illustrate embodiments that utilize different allocations. In some embodiments, the gNB adapts the resource allocations used to transfer the traffic in both the time domain and frequency domain. This provides for improved, and potentially, maximum flexibility. An example is shown in FIG. 9A. Referring to FIG. 9A, rectangle 902 represents the nominal DL SPS PDSCH, and rectangle 901 represents the actual DL SPS PDSCH. More specifically, with respect to supporting adaption of the resource allocations in both the time domain and frequency domain, in some embodiments, the gNB embeds signaling information in part of the DL SPS PDSCH, so the UE can detect the embedded information to determine the current DL SPS resources. FIGS. 10A-10D provide an example.

Referring to FIGS. 10A-10D, rectangles 1001 and 1011 represent the nominal DL SPS PDSCH, rectangles 1003 and 1030 represents the actual DL SPS PDSCH. In FIG. 10A, blocks 1001, 1002, and 1003 are for resource usage for the current DL SPS, while embedded signaling is shown as round-cornered block 1002 in FIG. 10A with overlaid resource usages. Rounded-corner blocks representing embedded signaling are present for all the allowed resource usages and are also shown as blocks 1010, 1020, and 1030 in FIGS. 10B-10D, respectively. For the case in which no resource is used, there are two choices. First, the embedded signaling is non-existent. In this case, the UE behavior is to decide among {resource usage 1, resource usage 2, . . . , non-resource usage}, and DTX (Discontinued Transmission) from gNB needs to be detected by the UE. Second, the embedded signaling is present, e.g. a sequence is embedded to signify non-existent PDSCH transmission. The embedded signaling shown as block with contiguous resources is for illustration only. The embedded signaling can be distributed in the time and/or frequency. In some embodiments, the detection of the embedded signaling depends on DMRS of the DL SPS PDSCH. When that is required, part of the DMRS for the DL SPS PDSCH is transmitted, e.g., the first DMRS in the DL SPS PDSCH is transmitted.

Referring back, FIG. 9B illustrates an example of a gNB supporting adaptation in the time domain only. FIGS. 12A-12B illustrate one example of supporting resource adaptation in the time domain only. Referring to FIGS. 12A-12B, rectangles 1202, 1204 and 1206 represent the nominal DL SPS PDSCH, with embedded signaling shown as blocks 1201, 1203, and 1205, respectively. In the examples of FIGS. 12A-12B, the time domain resource adaptation is for the number of OFDM symbols taken within a slot. However, in some embodiments, the resource indication can be also considered for the number of PDSCHs with different transport blocks. In FIGS. 12A-12C, a video encoder generates packets with sizes like 1500 bytes, 3000 bytes, 4500 bytes. Assume 1500 bytes can be sent with 5 OFDM symbols at a given MCS level; 10 OFDMs are needed at a given MCS level for 3000 bytes, 14 OFDM symbols are needed at a given MCS level for 4500 bytes. Thus, in the example, by changing the number of OFDM symbols taken within a slot, the number of REs in the PDSCH is changed, and consequently with a given MCS that can be signaled by the activation DCI of a DL SPS configuration, the transport block size is changed, thereby accommodating the different number of bytes in a different transmission, thereby providing the time domain resource adaptation for the number of OFDM symbols with a slot.

In some embodiments, the resource indication is also considered for the number of PDSCHs with different transport blocks. For example, as shown in FIGS. 13A-13B, a video encoder generates packets with sizes 1500 bytes, 3000 bytes, 4500 bytes. Assuming 1500 bytes can be sent with one PDSCH 1302 (with embedded signaling shown as block 1301) at a given MCS level, then 2 PDSCHs 1302 and 1303 (with embedded signaling shown as block 1301) are needed for 3000 bytes and 3 PDSCHs 1302, 1303 and 1304 (with embedded signaling shown as 1301) block are needed for 4500 bytes.

Referring back, FIG. 9C is an example of a gNB supporting adaptation in the frequency domain only. FIGS. 14A-14C illustrates examples of such adaptation. Referring to FIGS. 14A-14C, rectangles 1402, 1404 and 1406 represent the nominal DL SPS PDSCH which cover different sized portions of the frequency domain, with embedded signaling shown as blocks 1401, 1403, and 1405, respectively.

Note that with the embodiments of FIGS. 9A and 9C, the UE needs to wait for the detection of the embedded signaling before PDSCH demodulation processing.

With the embodiment of FIG. 9B, the actual resource allocation is specified in the beginning one or more symbols (rectangle 903) and the remainder of the DL SPS PDSCH follows (rectangle 904). Since the UE can start processing PDSCH from the very first symbol, the situation with UE processing timing is more favorable than those for FIGS. 9A and 9C. However, channel estimation, especially time domain interpolation, may still need to wait for the decoding of the embedded signaling before moving forward. For example, with case 1 of FIG. 11A, time-domain interpolation is used, and with case 2 of FIG. 11B, time domain interpolation is not used. To allow the UE to come to decision as to whether to perform time domain interpolation or not, the detection of the signaling for resource adaption is very simple, so the required processing doesn't hold up the UE processing.

With the embodiment of FIG. 9B, the signaling for resource adaptation comprises signaling for PDSCH duration indication. As successful decoding of PDSCH is conditioned on correct decoding of the PDSCH duration indication, the signaling design is robust.

FIG. 11B illustrates an example of PDSCH DM-RS positons for single-symbol DM-RS.

Resource Indication

Figure 15:
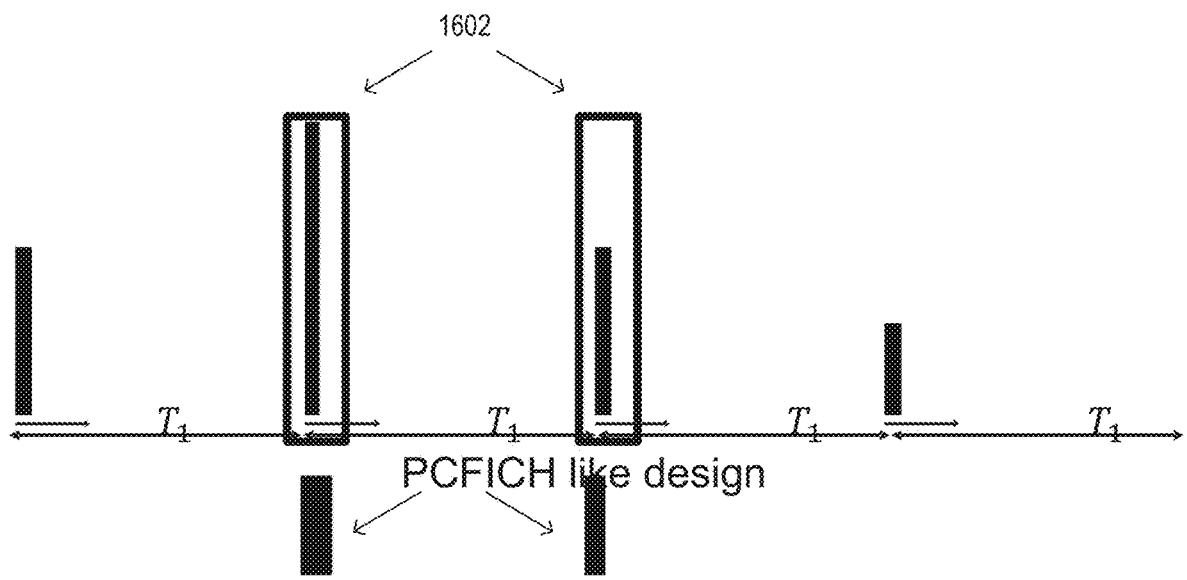
FIG. 15 illustrates one embodiment of the PCFICH-like design.

In some embodiments, to handle time-varying packet size, the gNB embed signaling a resource indication (e.g., resource indication information) is performed in a similar fashion to a PCFICH using the first few symbols of DL SPS PDSCH, so the number of symbols used for SPS can be indicated to the UE and detected by the UE. FIG. 15 illustrates one embodiment of the PCFICH-like design. Recall in LTE, PCFICH can be used to indicate 1, 2 or 3 symbol duration for PDCCH. In this case, however, the number of PDSCH lengths is indicated be M (e.g., M=3), L is the number of symbols for a DL SPS PDSCH which is determined according to the activation DCI, and then the number of symbols in the current PDSCH is $[L/M \times m], 1 \leq m \leq M,$ where m is dynamically indicated.

In some embodiments, the indication channel ("PCFICH-like channel") occupies all PRBs, and the first DMRS is used for demodulation for the embedded signaling.

By providing the resource indication as part of the DL SPS, the processing effort is less than decoding on PDCCH.

In some embodiments, the gNB indicates a number of durations (e.g., 2 code states, 3 code states, etc.). In some cases, for a specific video codec output, the packet sizes may not be commensurate with a basis unit. For example, it may happen that packet sizes may actually be something like, for example, 100 bytes, 200 bytes, and 800 bytes. Hence, in order to accommodate such cases, in some embodiments, a mapping from the expected transport block size and resource indication signaling is created.

In some embodiments, the RRC configuration is used to signal the resource indication. In some embodiments, M scaling factors {e.g., s1, s2, s3} are signaled, with RRC signaling, to indicate different durations to the UE, where the first value s1 is for the first code state, the 2nd value is for the second state, $[L \times s_m/s_M], 1 \leq m \leq M$ In some embodiments, the duration indication is signaled with the medium access control (MAC) control element (CE). In some other embodiments, both RRC and MAC CE are used to signal the resource indication.

In some embodiments, the resource indication is spread over the whole frequency allocation of the DL SPS PDSCH. In embodiments where a gNB supporting adaptation in the time domain only, all the PRBs can be used, or all the PRBs over whole resource allocation bundles can be used. In embodiments where a gNB supporting adaptation in the frequency domain only or in both the frequency and time domains, some PRBs can be used.

In some embodiments, rate matching of PDSCH data is performed over those REs taken by duration indication. In some embodiments, the number of REs taken by duration indication or the ratio of the REs taken by duration indication and the nominal DL SPS PDSCH can be RRC configured, or derived from a formula depending on the MCS level of the PDSCH allocation. For example, when the MCS level of PDSCH is low (e.g. 2 or 3), the targeted SINR for PDSCH is low. In some embodiments, to ensure robust reception of the embedded signaling, proportionally more resources are given to the embedded signaling, and when MCS level is high, the targeted SINR for PDSCH high, proportionally fewer resources are given to the embedded signaling.

Figure 16:
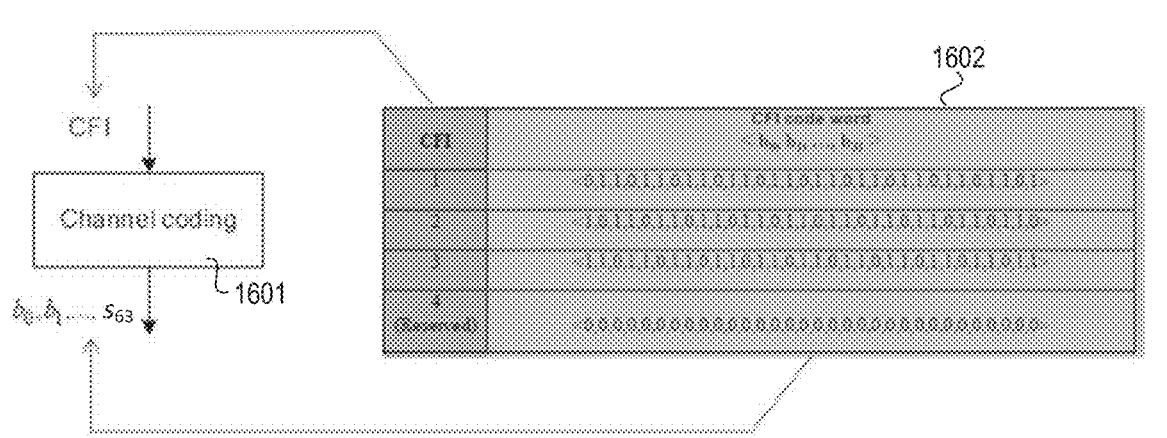
FIG. 16 illustrates an example of channel coding where CFI codewords for each CFI are set forth.

In some embodiments, channel coding is used to indicate duration indication. In other word, different codes are used to represent different duration indications from a plurality of duration indications. In some embodiments, more than three durations are used for scheduling instances. In such a case, in some embodiments, channel coding is used encode the duration indications. In some embodiments, Reed-Muller encoding is used to encode the duration indications. In some embodiments, a short block code with maximum distance profile is used to encode the duration indications. FIG. 16 illustrates an example of channel coding 1601 where CFI codewords 1602 for each CFI are set forth.

In some embodiments, the signaling for the embedded signaling provide a resource indication in a number of different ways. FIG. 17 illustrates examples of a DL SPS configuration for resource indication in which NoOfSymbols (1702) is for the number of symbols with the resource indication presence, and ResourceRatio (1702) signifies the percentage of REs for the resource indication from resource elements (REs) from the symbols indicated by NoOfSymbol, excluding those taken by DMRS and PTRS. Also shown is an example of non-integer periodicity through $M_1$ and $M_2$, (1701). In the example, NoOfSymbols=1, ResourceRatio=f0p5. As 6 REs are taken by DMRS on the first symbol in an allocation, and PTRS is not present, 12 REs are available, with ResourceRatio=f0p5, then fifty percent of the available REs are dedicated to resource indication, hence 6 REs are used for resource indication.

Note that FIG. 11A illustrates an example of the boxes used for actual data transmission on PDSCH.

FIG. 18 is a data flow diagram of one embodiment of a process performed by a UE for handling time-varying packet size that occurs in the downlink. The process is performed by processing logic that may comprise hardware (circuitry, dedicated logic, etc.), software (such as is run on a general-purpose computer system, a server, or a dedicated machine), firmware, or a combination of the three.

Referring to FIG. 18, the process begins by processing logic receiving a first signaling comprising configuration of downlink (DL) Semi-Persistent Scheduling (SPS), where the DL SPS configuration comprises a periodicity of the DL SPS and an indication for a first physical layer resource, and wherein the first physical layer resource is used to dynamically modify size of a second physical layer resource for SPS DL data transmission (processing block 1801). In one embodiment, the first signaling comprises RRC signaling. In one embodiment, the indication comprises a number of symbol indication and resource ration (e.g., 1702 of FIG. 17).

Then, processing logic receives a second signaling that activates reception based on the DL SPS, wherein the second signaling comprises information to specify a boundary of the second physical layer resource (processing logic 1802). In one embodiment, the second signaling comprises physical layer signaling, such as, but not limited to, DCI.

Next, processing logic monitors the first physical layer resource on each SPS occasion based on the periodicity (processing logic 1803) and determines the size of the second physical layer resource for SPS DL data transmission, based on the first physical layer resource (processing logic 1804).

With this information, processing logic receives data on the second physical layer resource determined for each SPS occasion based on the determined size (processing logic 1805).

Optionally, in some embodiments, processing logic receives information specifying occurrence of a Discontinuous Reception (DRX) when a data transmission is larger than can be specified for SPS resources designated for DL SPS transmission (processing block 1806). In one embodiment, the DRX configuration is part of RRC signaling, which can be sent by the gNB to the UE along with 1801.

FIG. 19 is a data flow diagram of one embodiment of a process performed by a network equipment, such as, for example, a base station, for handling time-varying packet size that occurs in the downlink. The process is performed by processing logic that may comprise hardware (circuitry, dedicated logic, etc.), software (such as is run on a general-purpose computer system, a server, or a dedicated machine), firmware, or a combination of the three.

Referring to FIG. 19, the process begins by processing logic transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission (processing block 1901). In one embodiment, the first signaling comprises RRC signaling. In one embodiment, the indication comprises a number of symbol indication and resource ration (e.g., 1702 of FIG. 17).

Then, processing logic transmits a second signaling to the UE to activate, on the UE, reception based on the DL SPS, wherein the second signaling comprises information to specify a boundary of the second physical layer resource (processing block 1902). In one embodiment, the second signaling comprises physical layer signaling, such as, but not limited to, DCI.

Next, processing logic determines size of the second physical layer resource for SPS DL data transmission for each SPS occasion (processing block 1903) and transmitting the first physical layer resource for each SPS occasion according to the periodicity (processing block 1904).

Thereafter, processing logic transmits data to the UE on the second physical layer resource for each SPS occasion according to the determined size (processing block 1905).

Optionally, processing logic sends information specifying occurrence of a Discontinuous Reception (DRX) when a data transmission is larger than can be specified for SPS resources designated for DL SPS transmission (processing block 1906).

There are a number of example embodiments described herein.

Example 1 is a method performed by a user equipment (UE) comprising:
  receiving a first signaling comprising configuration of downlink (DL) Semi-Persistent Scheduling (SPS), wherein the DL SPS configuration comprises a periodicity of the DL SPS and a first indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity to decode a second indication; determining the size of the second physical layer resource for SPS DL data transmission, based on the second indication; and receiving data on the second physical layer resource determined for each SPS occasion based on the determined size.

Example 2 is the method of example 1 that may optionally include that the second indication comprises a number of symbols.

Example 3 is the method of example 1 that may optionally include that the first signaling is an RRC signaling.

Example 4 is the method of example 1 that may optionally include that the second indication specifies one of a plurality of different duration indications.

Example 5 is the method of example 4 that may optionally include that different duration indications of the plurality of duration indications are signaled with a different code states.

Example 6 is the method of example 4 that may optionally include that second indications are encoded using Reed-Muller encoding.

Example 7 is the method of example 4 that may optionally include that second indications are encoded using block codes.

Example 8 is the method of example 1 that may optionally include that the first indication is signaled via a medium access control (MAC) control element (CE).

Example 9 is the method of example 1 that may optionally include that the second indication specifies time domain and frequency domain resource allocations.

Example 10 is the method of example 1 that may optionally include that the second indication specifies frequency domain resource allocations.

Example 11 is the method of example 1 that may optionally include receiving information specifying occurrence of a Discontinuous Reception (DRX) when a data transmission is larger than can be specified for SPS resources designated for DL SPS transmission.

Example 12 is a UE comprising one or more processors configured to perform operations comprising: receiving a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity; determining the size of the second physical layer resource for SPS DL data transmission, based on the first physical layer resource; and receiving data on the second physical layer resource determined for each SPS occasion based on the determined size.

Example 13 is the UE of example 12 that may optionally include that the one or more processors perform the one or more operations associated with one or more of the methods of examples 2-11.

Example 14 is a baseband processor of a wireless user equipment (UE) configured to perform operations comprising: receiving a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity; determining the size of the second physical layer resource for SPS DL data transmission, based on the first physical layer resource; and receiving data on the second physical layer resource determined for each SPS occasion based on the determined size.

Example 15 is the baseband processor of example 14 that may optionally include that the one or more processors perform operations associated with one or more of the methods of examples 2-11.

Example 16 is a non-transitory machine-readable medium having executable instructions to cause one or more processing units of a UE to perform a method comprising: receiving a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission; receiving a second signaling that activates reception based on the DL SPS, wherein the second signaling comprises information to specify a boundary of the second physical layer resource; monitoring the first physical layer resource on each SPS occasion based on the periodicity; determining the size of the second physical layer resource for SPS DL data transmission, based on the first physical layer resource; and receiving data on the second physical layer resource determined for each SPS occasion based on the determined size.

Example 17 is the machine-readable medium of example 16 that may optionally include that the method comprises one or more of the methods of examples 2-11.

Example 18 is a method for use with a base station, the method comprising: transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; transmitting data to the UE on the second physical layer resource for each SPS occasion according to the determined size.

Example 19 is the method of example 18 that may optionally include that the second indication comprises a number of symbols.

Example 20 is the method of example 18 that may optionally include that the first signaling is an RRC signaling.

Example 21 is the method of example 18 that may optionally include that the second indication specifies one of a plurality of different duration indications.

Example 22 is the method of example 21 that may optionally include that different duration indications of the plurality of duration indications are signaled with a different code states.

Example 23 is the method of example 21 that may optionally include that the second indications are encoded using Reed-Muller encoding.

Example 24 is the method of example 21 that may optionally include that wherein second indications are encoded using block codes Example 25 is the method of example 18 that may optionally include that the first indication is signaled via a medium access control (MAC) control element (CE).

Example 26 is the method of example 18 that may optionally include that the second indication specifies time domain and frequency domain resource allocations.

Example 27 is the method of example 26 that may optionally include that the indication specifies frequency domain resource allocations.

Example 28 is the method of example 26 that may optionally include sending configuration information specifying occurrence of a Discontinuous Reception (DRX) when a data transmission is larger than can be specified for SPS resources designated for DL SPS transmission.

Example 29 is a base station comprising one or more processors configured to perform the operations comprising: transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DI data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; transmitting data to the UE on the second physical layer resource for each SPS occasion according to the determined size.

Example 30 is the base station of example 29 that may optionally include that the one or more processors perform operations associated with one or more of the methods of examples 19-28.

Example 31 is a baseband processor of a base station configured to perform operations comprising: transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; transmitting data to the UE on the second physical layer resource for each SPS occasion according to the determined size.

Example 32 is the baseband processor of example 31 that may optionally include that the one or more processors perform operations associated with one or more of the methods of examples 19-28.

Example 33 is one or more non-transitory computer readable storage media having instructions stored therein which, when executed by one or more processors of a base station, cause the base station to perform operations comprising: transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission; transmitting a second signaling to the UE to activate, on the UE, reception based on the DL SPS, wherein the second signaling comprises information to specify a boundary of the second physical layer resource; determining size of the second physical layer resource for SPS DL data transmission for each SPS occasion; transmitting the first physical layer resource for each SPS occasion according to the periodicity; and transmitting data to the UE on the second physical layer resource for each SPS occasion according to the determined size.

Example 34 is the machine-readable medium of example 33 that may optionally include that the method comprises one or more of the methods of examples 19-28.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMS, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "sending," "receiving," "switching," "receiving," "communicating," "transmitting," "aggregating," "monitoring," "removing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A method performed by a user equipment (UE) comprising:
   receiving a first signaling comprising configuration of downlink (DL) Semi-Persistent Scheduling (SPS), wherein the DL SPS configuration comprises a periodicity of the DL SPS and a first indication for a first physical layer resource, and wherein the first physical layer resource is used to dynamically modify size of a second physical layer resource for SPS DL data transmission;
   receiving a second signaling that activates reception based on the DL SPS, wherein the second signaling comprises information to specify a boundary of the second physical layer resource;
   monitoring the first physical layer resource on each SPS occasion based on the periodicity to decode a second indication;
   determining the size of the second physical layer resource for SPS DL data transmission, based on the second indication; and
   receiving data on the second physical layer resource determined for each SPS occasion based on the determined size.

2. The method of claim 1 wherein the second indication comprises a number of symbols.

3. The method of claim 1 wherein the first signaling is an RRC signaling.

4. The method of claim 1 wherein the second indication specifies one of a plurality of different duration indications.

5. The method of claim 4 wherein different duration indications of the plurality of duration indications are signaled with a different code states.

6. The method of claim 4 wherein the second indications are encoded using Reed-Muller encoding.

7. The method of claim 4 wherein second indications are encoded using block codes.

8. The method of claim 1 wherein the first indication is signaled via a medium access control (MAC) control element (CE).

9. The method of claim 1 wherein the second indication specifies time domain and frequency domain resource allocations.

10. The method of claim 1 wherein the second indication specifies frequency domain resource allocations.

11. The method of claim 1 further comprising receiving information specifying occurrence of a Discontinuous Reception (DRX) when a data transmission is larger than can be specified for SPS resources designated for DL SPS transmission.

12. A UE comprising one or more processors configured to perform operations comprising:
   receiving a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission;
   receiving a second signaling that activates reception based on the DL SPS, wherein the second signaling comprises information to specify a boundary of the second physical layer resource;
   monitoring the first physical layer resource on each SPS occasion based on the periodicity;
   determining the size of the second physical layer resource for SPS DL data transmission, based on the first physical layer resource; and
   receiving data on the second physical layer resource determined for each SPS occasion based on the determined size.

13. The UE of claim 12 wherein the one or more processors perform the one or more operations associated with one or more of the methods of claims 2-11.

14. A baseband processor of a wireless user equipment (UE) configured to perform operations comprising:
   receiving a first signaling comprising configuration of downlink (DL) Semi-Persistent Scheduling (SPS), wherein the DL SPS configuration comprises a periodicity of the DL SPS and an indication for a first physical layer resource, and wherein the first physical layer resource is used to dynamically modify size of a second physical layer resource for SPS DL data transmission;
   receiving a second signaling that activates reception based on the DL SPS, wherein the second signaling comprises information to specify a boundary of the second physical layer resource;
   monitoring the first physical layer resource on each SPS occasion based on the periodicity;
   determining the size of the second physical layer resource for SPS DL data transmission, based on the first physical layer resource; and
   receiving data on the second physical layer resource determined for each SPS occasion based on the determined size.

15. A method for use with a base station, the method comprising:
   transmitting, to a user equipment (UE), a first signaling comprising configuration of downlink (DL) Semi-Persistent Scheduling (SPS), wherein the DL SPS configuration comprises a periodicity of the DL SPS and an indication for a first physical layer resource, wherein the first physical layer resource is used to dynamically modify size of a second physical layer resource for SPS DL data transmission;
   transmitting a second signaling to the UE to activate, on the UE, reception based on the DL SPS, wherein the second signaling comprises information to specify a boundary of the second physical layer resource;
   determining size of the second physical layer resource for SPS DL data transmission for each SPS occasion;
   transmitting the first physical layer resource for each SPS occasion according to the periodicity;
   transmitting data to the UE on the second physical layer resource for each SPS occasion according to the determined size.

16. The method of claim 15 wherein the second indication comprises a number of symbols.

17. The method of claim 15 wherein the first signaling is an RRC signaling.

18. The method of claim 15 wherein the second indication specifies one of a plurality of different duration indications.

19. The method of claim 15 wherein the first indication is signaled via a medium access control (MAC) control element (CE).

20. The method of claim 15 wherein the second indication specifies time domain and frequency domain resource allocations.

\* \* \* \* \*